United States Patent [19]

Smith

[11] 4,451,738
[45] May 29, 1984

[54] MICROCIRCUIT FABRICATION

[75] Inventor: Kenneth C. A. Smith, Cambridge, England

[73] Assignee: National Research Development Corporation, London, England

[21] Appl. No.: 286,715

[22] Filed: Jul. 24, 1981

[30] Foreign Application Priority Data

Jul. 28, 1980 [GB] United Kingdom ................. 8024640

[51] Int. Cl.³ ............................................. H01J 37/00
[52] U.S. Cl. ................................ 250/492.2; 250/491.1
[58] Field of Search ............ 250/492.2, 396 ML, 398, 250/442, 491

[56] References Cited

U.S. PATENT DOCUMENTS

| 3,434,894 | 3/1969 | Gale | 250/492.2 |
|---|---|---|---|
| 3,870,891 | 3/1975 | Mulvey | 250/396 ML |
| 4,088,895 | 5/1978 | Martin | 250/492.2 |
| 4,109,029 | 8/1978 | Ozdemir et al. | 250/492.2 |
| 4,139,774 | 2/1979 | Katagiri | 250/492.2 |
| 4,151,420 | 4/1979 | Keller et al. | 250/492.2 |

FOREIGN PATENT DOCUMENTS 2041639A  9/1980  United Kingdom .
1594465  7/1981  United Kingdom .

Primary Examiner—Bruce C. Anderson
Attorney, Agent, or Firm—Cushman, Darby & Cushman

[57] ABSTRACT

The fabrication of a microcircuit by beam lithography requires an economic distribution of processing time between the high resolution portions of the exposure pattern and areas of much lower resolution. At least one ion beam provides the high resolution performance and at least one electron beam satisfies the lower resolution requirement. The beams are independently operable and are relatively inclined for substantial convergence at the substrate. The convergence is such that all beams can be scanned simultaneously in a single elemental area of substrate or in adjacent elemental areas which are presented for exposure in sequence. For registration the substrate is imaged by electron scanning and the positions of registration marks are related in the image to predetermined positions which represent the required position of the substrate. A positional correction signal is derived by observation of image brightness, size and orientation at the predetermined positions. The signal is processed by a computer which holds all positional control and scan control data and instructs the relevant controls.

16 Claims, 5 Drawing Figures

MICROCIRCUIT FABRICATION

The invention relates to microcircuit fabrication, particularly in the use of focused beams of particles for direct writing on a substrate.

The pattern of conductors and device boundaries which forms the basis of a microcircuit is exposed in a resist coating which is usually applied to a silicon wafer. The irradiating energy for exposure may be optical or may be supplied by a beam of particles. Electron beams have been used for this purpose and have enabled resolution in the sub-micron range to be achieved. Special allowance has to be made, however, for scattering within the resist layer and backscattering from the substrate which partially expose the elements adjacent to that directly beneath the beam and constitute the so-called proximity effect. For an ion beam the effect is negligible and there has been recent interest in the potential use of such beams to obtain even finer resolution. The adoption of any process for microcircuit fabrication depends among other factors on the production rate obtainable and the writing speed of a beam is inevitably reduced as resolution is increased. Particularly in progressing towards very largescale integrated circuits the highest resolution is demanded and the ability to make advantageous use of the properties of the ion beam will depend on the achievement of an acceptable overall processing time.

In accordance with one aspect of the invention there is provided an apparatus for microcircuit fabrication comprising means for presenting a substrate for exposure during an exposure interval, means for producing independently of each other at least one ion beam and at least one electron beam, the axes of the beams being relatively inclined for substantial convergence at the substrate, means for focusing each ion beam on the surface of the substrate at the highest required resolution, means for focusing each electron beam on the surface of the substrate at a lower resolution and means for scanning each beam across the surface to produce during the exposure interval a respective portion of a desired exposure pattern.

In the simplest ase a single ion beam may be used to produce highly resolved boundaries in the pattern, the areas within the boundaries being produced by a relatively coarsely focused electron beam.

Each of a plurality of elemental areas of the substrate may be presented in succession for exposure at a single location.

Alternatively each of a plurality of elemental areas of the substrate may be presented in succession for exposure at each of a plurality of locations, the means for scanning being so arranged that scanning of the elemental area at one location by one of the beams is carried out during the same exposure interval as the scanning of a different elemental area at a different location by a different beam.

The means for producing each electron beam comprises an electron gun, at least one of which guns may have a field-emission cathode.

The means for focusing at least one of the electron beams may comprise a single-pole magnetic lens having a pole-piece nose which extends along the relevant beam axis towards the cathode.

The means for focusing an ion beam may include a single-pole magnetic lens having a pole-piece nose which extends along the beam axis towards the source of the ion beam, the lens being arranged externally of the vacuum enclosure adjacent the relevant elemental area of the substrate.

Registration means may be provided for causing the substrate to be adjusted to a predetermined position, the registration means including means for storing values representing the predetermined position of the substrate, means for deriving values representing the actual position of the substrate, means for comparing the predetermined and actual positions and means for displacing the substrate to cause the positions to coincide.

The registration means may include means for detecting secondary electrons produced by scanning with one of the electron beams an area of the substrate having a registration mark, means for displaying the scanned area and means for designating in the display the predetermined position for the registration mark, the substrate being displaced to cause the displayed mark to conform to the designated position. In order to deal with simultaneous errors in lateral positioning and orientation two registration marks must be observed. For the separation of the images of two registration marks the respective scanning beams may be of different energy the detection means being energy selective.

Alternatively scanning and detection sequences may be time-shared between the two marks. As a further and preferred alternative, not dependent on separation the apparatus may include means for detecting secondary electrons produced by synchronised scanning with two electron beams of respective areas of the substrate each having a registration mark, and means for displaying the scanned areas in superimposition such that at a single position in the display the respective predetermined positions for each of the registration marks coincide, the substrate being displaced to cause the displayed marks to coincide at the single position.

The apparatus may provide automatic control (if the scanned area display is luminous) by including means for detecting the distribution of luminosity in the display to provide a correction signal for displacing the substrate to the predetermined position.

In accordance with another aspect of the invention a method of microcircuit fabrication comprises the operations of presenting a substrate for exposure during an exposure interval, producing independently of each other at least one ion beam and at least one electron beam, the axes of the beams being relatively inclined for substantial convergence at the substrate, focusing each ion beam on the surface of the substrate at the highest required resolution, focusing each electron beam on the surface of the substrate at a lower resolution than that of each ion beam, and scanning each beam across the surface to produce during the exposure interval a respective portion of a desired exposure pattern.

The method may further include registration of the substrate with a predetermined position, such registration comprising the operations of electron beam scanning the substrate to produce secondary electron images of two areas of the substrate each having a registration mark, superimposing the images synchronously in a luminous display such that a single position in the display represents the predetermined position for each of the registration marks, sensing the distribution of luminosity of the display to provide a correction signal related to the desired coincidence of the marks in the display at the single position, and causing the substrate to be displaced in response to the correction signal to produce such coincidence.

It has been observed that one approach taken to the solution of the writing speed problem has been the attempted development of ion sources of such high brightness that all the features of a circuit could be exposed in the desired time. It is considered by the present inventor that such an approach is unnecessarily restrictive in attempting to provide the highest writing speed in a beam of the highest resolution. In general only a small part of the total exposure pattern of the microcircuit requires high resolution and the complementary part of the pattern is entirely satisfactory if written at lower resolution. It is then advantageous to use an easily produced electron beam for the lower resolution area. The beam current can be higher in a coarsely focused beam with consequently increased writing speed and thus a larger area is exposed in each sweep. Since precise edges or lines are not intended to be produced in this way the presence of the proximity effect is of no significance. It will always be necessary to consider the scanning program required for any specific microcircuit to determine the relative demand for high resolution writing and for low resolution in order that writing duty is allocated to the available beams with the greatest economy of time. The high resolution scanning duty can of course be divided between two or more ion beams and the lower resolution duty can be divided between two or more electorn beams. In all cases the contribution of any single beam is complementary to the combined contribution of the other beams in completing the exposure pattern of each elemental area. The invention is thus conceptually remote from proposals for the use of a plurality of similar beams each performing a similar task and arranged on parallel axes.

A further step for consideration in the control of the overall processing time is the registration of each successive element of the circuit pattern with the co-ordinate system of the electron optics. As an optional feature of a complementary beam equipment an arrangement is provided for scanning registration marks which is amenable to recognition of an in-register condition by automatic means.

In co-pending British patent application No. 8001683, which was published as No. 2041639A and on which was based co-pending U.S. application Ser. No. 114,318 filed Jan. 22, 1980, the present inventor has disclosed the co-ordinated scanning of a plurality of electron beams for the exposure of complementary features of a pattern. Preferred forms of apparatus for carrying out that invention include lens arrangements for focusing in which adjacent electron beams may have a closer angular spacing than would conventionally be possible, so that the angle of incidence does not depart from the normal to a disadvantageous extent. The same feature is intended to be used, dependent on the application, in certain embodiments of the present invention. The system now appears to allow more tolerance in the control of electron beam diameters since the highest resolution which is required has been provided by means of one or more ion beams using only small electrostatic lenses above the substrate. The requirement remains however that an electron beam of certain diameter must contain as much current as possible so that the working distance must be short. It is this constraint which creates the problem of accommodating lenses at close angular spacing. Compact forms of conventional magnetic lens or single-pole lenses alleviate the difficulty but the absence of such lenses in the critical region is an important advantage of the use of an ion beam.

The method of the invention and particular embodiments of the apparatus will be described with reference to the accompanying drawings in which.

Figure 1:
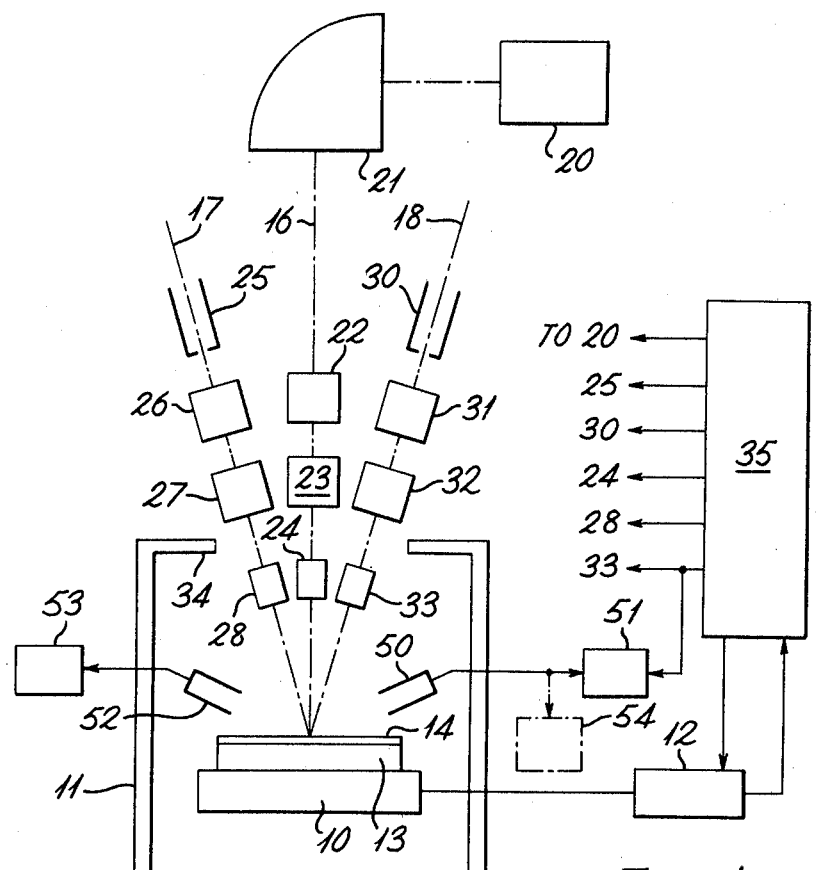
FIG. 1 represents schematically a microcircuit fabrication system in accordance with the invention.

Referring to FIG. 1 a specimen stage 10 mounted at one end of a high-vacuum column 11 includes drive mechanisms for bi-axial and rotary motion with a control unit 12 to enable the stage to be precisely positioned at each step in the process. Such mechanisms are known and will not be illustrated or described. The stage 10 carries a substrate 13 which is to be processed, for example a silicon wafer which may be 100 mm or more in diameter. The substrate 13 is coated with a thin layer 14 of resist material such as polymethyl methacrylate, the solubility of which is affected by irradiation in the desired exposure pattern.

High-resolution irradiation is produced by an ion beam which is scanned about an optical axis 16, normal to layer 14 and indicated by a broken line. Differing degrees of lower resolution irradiation are produced by electron beams on axes 17, 18 which are inclined to the axis 16 and converge to the same elemental area of layer 14. An ion gun duoplasmatron 20 yields ions by extraction from a magnetically confined gas-discharge. The ions are directed perpendicularly to axis 16 to pass through a magnetic sector 21 from which ions of substantially uniform mass emerge along axis 16. The ion beam is focused electrostatically be a condenser 22 which represents the first of two or more stages of focusing spaced apart along axis 16. The final focal stage at a lens 23 is brought as close as possible to the layer 14 in order to minimise focusing aberrations and a post-lens electrostatic deflection system 24 can be made appropriately compact.

A conventional electron gun 25 having a thermal emission cathode is mounted on axis 17 and first and second magnetic condenser lenses 26, 27 are indicated. Lens 27 lies near lens 23 and is made as small as possible so that the angle between axes 16 and 17 need not be large. The electron beam on axis 17 is scanned by means of an electrostatic deflection system 28. A second electron gun 30 is mounted on axis 18 to produce an electron beam which is focused by magnetic lenses 31, 32 and deflected by a system 33 in a manner similar to the beam on axis 17. The current carried by the electron beams and their resolution relative to each other and to the ion beam is determined by the power of the lenses 26, 31 and the aperture sizes associated with lenses 27, 32.

It will be noted that vacuum column 11 is shown as extending upwards only to a level just above that of the electrostatic deflection systems 24, 28, 33 where the column terminates in a flange 34. The beam systems 16, 17, 18 lie within individual vacuum enclosures (not shown) which are coupled to flange 34 and are so arranged that none of the magnetic focusing assemblies is exposed to vacuum.

The electron and ion beams are controlled by an exposure control unit 35 which includes a programmed computer holding the co-ordinates of all change points in the pattern and the corresponding states of all the beams. Control connections are therefore shown to the sources 20, 25, 30 to indicate the control of beam current on the axes 16–18 and to the deflection systems 24, 28 and 33. Data and control connections between units 12 and 35 are provided so that movement of specimen stage 10 is co-ordinated with the beam modulation and scanning.

Figure 2:
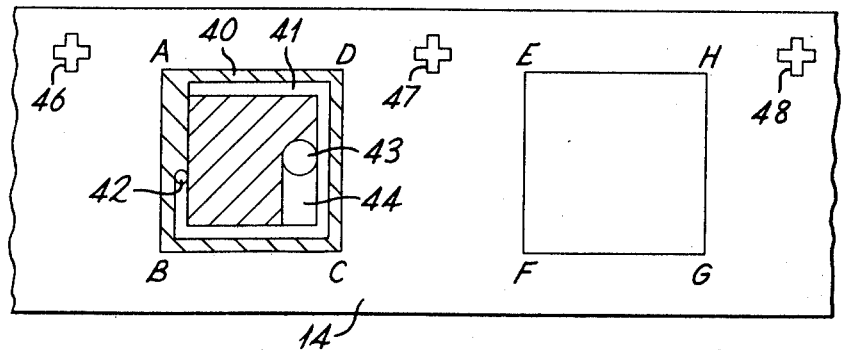
FIG. 2 illustrates the complementary scanning of the substrate of FIG. 1.

FIG. 2 indicates the complementary operation of an ion beam and an electron beam in a simple case. An elemental area of layer 14 is seen in an enlarged plan view in which the exposure of a square ABCD is required. The edges are defined by two lines 40, 41 side by side as produced by the ion beam. It is supposed that line 40 has been written and that line 41 is in progress, the position of the beam being indicated by a small circle 42. A larger circle 43 indicates the instantaneous position of an electron beam when scanning a strip 44 to complete the exposure of the inner area of square ABCD. At least two different degrees of resolution can thus be advantageously employed in the exposure of the critical and noncritical parts of a pattern. From the point of view of efficiency it is immaterial whether two beams should write simultaneously in the same element as shown or that one should write in the element ABCD while the other writes in the next element in sequence EFGH, the written areas being complementary in each case. The dimensions of the elemental areas are of course so small that two beams retain substantially the same degree of convergence whether they are arranged to write in the same element at one time or in adjacent or sequentially related elements. It will be apparent that one or more additional ion or electron beams at normal or inclined incidence can be programmed to scan in a similar complementary manner to increase the rate of exposure of each element or to provide intermediate degrees of resolution.

For the purpose of registration the substrate 13 carries readily identifiable features at precisely known positions to which each new scanning area must be related. Cross-shaped pads 46, 47, 48 represent such features. Imaging by means of secondary electron emission produced from pads 46 to 48 during ion beam scanning is relatively inefficient and it is a further advantage of a system which includes one or more electron beams that registration is simplified by electron beam scanning of the pads.

The registration process involves the manipulation of the specimen stage to cause the observed positions of two pads e.g. 46 and 47, or 46 and 48 to coincide with their calculated positions. The calculation is made in unit 35 by reference to the scanning coordinate system taking into account motion of the specimen stage under the control of unit 12. Images derived from scanning patterns centred on those calculated positions must then show the pads to be cantrally located when the coincidence is achieved. A problem arises in separating and identifying the image signals from two pads and alternative solutions are proposed. Referring again to FIG. 1 an electron collector 50 provides an output signal in the presence of backscattered or secondary electrons which is applied to modulate an image produced at a visual display unit 51. A similar collector 52 provides a signal to a display unit 53. In a first procedure two electron beams of different energy are used to scan pads 46, 47 respectively and the collectors 50, 52 are made to be energy selective. The respective energy components in the backscatter are then isolated by the collectors so that one of the pads 46, 47 is imaged at display unit 51 and the other at display unit 53. In a second procedure collector 52 is not used and images of the pads are separated in time by scanning each one in alternate frames with a single electron beam or with individual beams. An additional visual display unit 54 receives the output from detector 50 and display units 51 and 54 are synchronised with alternate frame signals so that the pad images appear separately.

Figure 3:
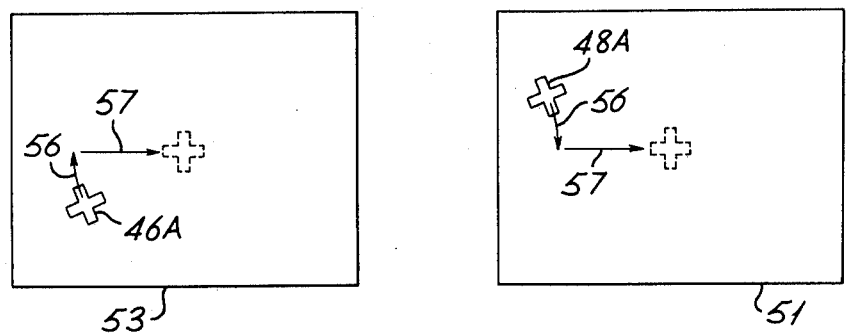
FIG. 3 illustrates the use of twin images for the registration of substrate markers.

The first procedure is illustrated in FIG. 3. The display shown at unit 51 represents the image of a raster scan by electron beam 18 (or an additional beam reserved for registration) over a small area of substrate 13. The scan area is positioned so that pad 48 will be exactly central when the stage 10 is correctly set and is large enough to cover pad 48 in its uncorrected position. An image 48A of pad 48 is seen to be tilted and displaced upwards from the centre of display 51. The display shown at unit 53 similarly represents an image of a scanned area which includes pad 46 and shows that an image 46A of pad 46 is tilted and displaced downwards from the centre of the display. On comparison of the displays, if necessary continuously while the position of the specimen stage is adjusted, the required combination of rotation and translation (as for example, paths 56, 57) can be found to centre the images in their respective areas. It is envisaged that the centralising process can be automated by deriving a feedback signal from an optical detector incorporated in each display unit and arranged to view the image. A detector of quadrant construction for example will provide a drive signal to cause the displacement of the image from any off-centre position towards the centre where a null signal is obtained. The signal is input to the control unit 35 from which the necessary corrective movement is instructed to unit 12.

Figure 4:
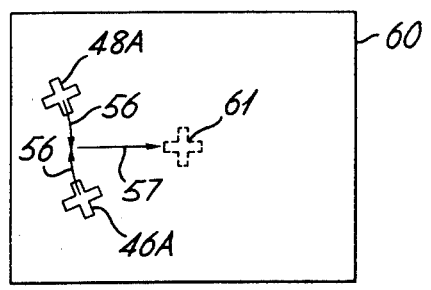
FIG. 4 illustrates the use of a single image for registration.

A further development of the first procedure is illustrated in FIG. 4. It is clearly advantageous to overcome the need to identify separately the backscatter inputs to detector 50 from the two areas of observation which include pads 46, 48 or any other pair. For separation with simultaneous viewing, an additional detector and an associated display are required and separation by time-sharing in scanning surface 14, or in the display, inevitably involves a degradation of signal:noise ratio. It is therefore preferred that separate electron beams should be used to scan the two areas simultaneously but that only a single detector should receive the combined backscatter input and that the resultant signal should form a single synchronous display. A display 60 in FIG. 4 thus represents a superimposition of the displays 51 and 53 of FIG. 3 and the pad images 46A, 48A appear left of centre and respectively below and above the horizontal centre line of display 60. As a result of the rotational correction step 56 (FIG. 3) the two pad images will coincide but remain displaced from the centre of display 60. The translational step 57 subsequently maintains the images in coincidence but positions them centrally at position 61. Other centralising routes may of course be followed. The presence of precisely superimposed images at position 61 is determined automatically by a detection system which responds first to the change in intensity at position 61 towards a maximum and second to the luminous area at position 61 which must be reduced to a minimum. Feedback signals from the detection system to exposure controller 35 cause position control instructions to be issued for the movement of stage 10 such that the pad images are centralised and superimposed. A quadrant detector, as proposed for the first procedure would again be suitable. The computing facility of unit 35 may be used advantageously to carry out a cross-correlation procedure on the input data with the rejection of spurious signals.

Figure 5:
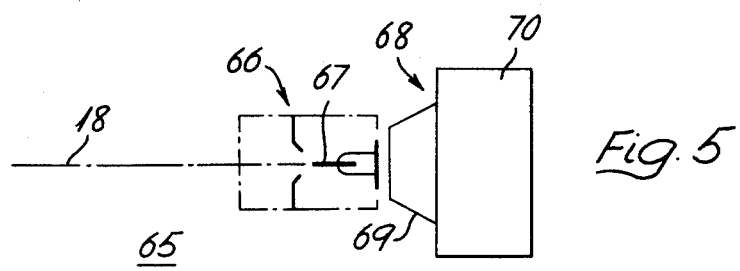
FIG. 5 represents diagrammatically an alternative electron source for the system of FIG. 1.

Referring again to the electron guns and lenses 25–27 and 30–32 of FIG. 1, which were of conventional construction, an alternative form is advantageous when higher resolution is required. FIG. 5 shows the structure of an electron source 65 for use on axis 18 of FIG. 1 in which one or both of the focusing stages 31, 32 can be dispensed with. Source 65 comprises a field-emission gun 66 in which emission occurs from the tip of a sharply pointed cathode 67 and is focused by a single pole magnetic lens 68 placed on axis 18 behind the gun 66. In the lens 68 a tapered pole-piece 69 projects from a coil and yoke assembly 70 towards gun 66 and a focusing field extends axially from pole-piece 69 sufficiently to be effective in the emission region of cathode 67. Because the assembly 70 lies at a position on axis 18 which is remote from stage 10 the use of such a focusing system enables the angular spacing between axes 16 and 18 to be made smaller than with conventional focusing. The use of a single-pole lens in focusing the beam from a field-emission cathode has been disclosed by the present inventor in co-pending British patent application No. 12175/77, which is now U.K. Pat. No. 1594465 and on which is based U.S. Pat. No. 4,315,152 filed Oct. 3, 1979, as a continuation of Ser. No. 888,991 filed Mar. 22, 1978, now abandoned.

In relation to an ion beam magnetic focusing is not generally suitable because of the dependence on particle mass but it is considered that an auxiliary focus element such as a single-pole lens 68 (FIG. 5) can usefully be placed on axis 16 below stage 10 in the apparatus of FIG. 1. The lens is placed with the pole-piece 69 directed towards the stage 10 so that a magnetic field extends from the lens to the beam landing side of the coasting 14 as an aid to the highest resolution.

In the general context of focusing it will be understood that in FIG. 1 the schematic representations of magnetic lenses such as lenses 27, 32 and of electrostatic lenses such as lens 23 imply no indication of relative size. The ion beam components are substantially smaller and allow space for the outer electron beam axes to be converged at a smaller angle than would be possible with a central electron beam.

The form of the ion source is not of course limited to that shown in FIG. 1. For example, high brightness has been obtained from an axially directed source in which ions are extracted from a tungsten tip on which a liquid layer of gallium is maintained.

I claim:

1. An apparatus for microcircuit fabrication comprising means for presenting a substrate for exposure during an exposure interval, means for producing independently of each other at least one ion beam and at least one electron beam, the axes of the beams being relatively inclined for substantial convergence at the substrate, means for focusing each ion beam on the surface of the substrate at a higher resolution, means for focusing each electron beam on the surface of the substrate at a lower resolution and means for scanning simultaneously said electron and ion beam across the surface to produce during the exposure interval a respective portion of a desired exposure pattern.

2. Apparatus according to claim 1 in which each of a plurality of elemental areas of the substrate is presented in succession for exposure at a single location.

3. Apparatus according to claim 1 in which each of a plurality of elemental areas of the substrate is presented in succession for exposure at each of a plurality of locations and the means for scanning is so arranged that scanning of the elemental area at one location by one of the beams is carried out during the same exposure interval as the scanning of a different elemental area at a different location by a different beam.

4. Apparatus according to claim 1 in which the means for producing each electron beam comprises an electron gun, at least one gun having a field-emission cathode.

5. Apparatus according to claim 4 in which the means for focusing at least that one of the electron beams which is produced from a field-emission cathode comprises a single-pole magnetic lens having a pole-piece nose which extends along the relevant beam axis towards the cathode.

6. Apparatus according to claim 5 in which such a single-pole lens is arranged externally of the vacuum enclosure adjacent the relevant cathode.

7. Apparatus according to claim 1 in which an ion beam is directed normally to the substrate and the means for focusing the ion beam includes a single-pole magnetic lens having a pole-piece nose which extends along the beam axis towards the source of the ion beam, the lens being arranged externally of the vacuum enclosure adjacent the relevant elemental area of the substrate.

8. Apparatus according to any preceding claim including registration means for causing the substrate to be adjusted to a predetermined position, the registration means including means for storing values representing the predetermined position of the substrate, means for deriving values representing the actual position of the substrate, means for comparing the predetermined and actual positions and means for displacing the substrate to cause the positions to coincide.

9. Apparatus according to claim 8 including means for detecting secondary electrons produced by scanning with one of the electron beams an area of the substrate having a registration mark, means for displaying the scanned area such that the predetermined position for the registration mark lies at a designated position in the display, the substrate being displayed to cause the displayed mark to conform to the designated position.

10. Apparatus according to claim 9 including means for detecting secondary electrons produced by scanning with a second electron beam a second area of the substrate having a registration mark, the electron beams being of different energy and the detecting means being energy-selective such that separate display signals are produced simultaneously for the two areas.

11. Apparatus according to claim 9 including means for scanning with said one of the electron beams during part of a display scan period and for scanning a second area of the substrate having a registration mark during a different part of the scan period of the same display such that the detecting means produces a display signal for the two areas in sequence.

12. Apparatus according to claim 8 having at least two electron beams and including means for detecting secondary electrons produced by synchronised scanning with two of the electron beams of respective areas of the substrate each having a registration mark, means for displaying the scanned areas in superimposition such that the respective predetermined positions for each of the registration marks coincide at a designated position in the display, the substrate being displaced to cause the displayed marks to coincide at that position.

13. Apparatus according to claim 9 in which the scanned area display is luminous including means for detecting the distribution of luminosity in the display to provide a correction signal for displacing the substrate to the predetermined position.

14. A method of microcircuit fabrication comprising the operations of presenting a substrate for exposure during an exposure interval, producing independently of each other at least one ion beam and at least one electron beam, the axes of the beams being relatively inclined for substantial convergence at the substrate, focusing each ion beam on the surface of the substrate at a higher resolution, focusing each electron beam on the surface of the substrate at a lower resolution than that of each ion beam, and scanning simultaneously said electron and ion beam across the surface to produce during the exposure interval a respective portion of a desired exposure pattern.

15. A method according to claim 14 further including registration of the substrate with a predetermined position, such registration comprising the operations of electron beam scanning the substrate to produce secondary electron images of two areas of the substrate each having a registration mark, superimposing the images synchronously in a luminous display such that a single position in the display represents the predetermined position for each of the registration marks, sensing the distribution of luminosity of the display to provide a correction signal related to the desired coincidence of the marks in the display at the single position, and causing the substrate to be displaced in response to the correction signal to produce such coincidence.

16. Apparatus according to claim 12 in which the scanned area display is luminous including means for detecting the distribution of luminosity in the display to provide a correction signal for displacing the substrate to the predetermined position.

* * * * *